United States Patent
Shimada

(10) Patent No.: US 6,713,571 B2
(45) Date of Patent: Mar. 30, 2004

(54) PROCESS FOR PRODUCING EPOXY RESIN COMPOSITION FOR PHOTOSEMICONDUCTOR ELEMENT ENCAPSULATION

(75) Inventor: Katsumi Shimada, Osaka (JP)

(73) Assignee: Nitto Denki Corporation, Osaka (JP)

( * ) Notice: Subject to any disclaimer, the term of this patent is extended or adjusted under 35 U.S.C. 154(b) by 0 days.

(21) Appl. No.: 10/013,551

(22) Filed: Dec. 13, 2001

(65) Prior Publication Data

US 2002/0117774 A1 Aug. 29, 2002

(30) Foreign Application Priority Data

Dec. 18, 2000 (JP) .................................. P.2000-383269

(51) Int. Cl.[7] .................... C08L 63/02; C08L 63/04; C08L 63/06; C08G 59/42
(52) U.S. Cl. ..................... 525/526; 525/481; 525/486; 525/504; 525/508; 525/523; 525/533
(58) Field of Search ................. 525/481, 486, 525/523, 526, 533, 504, 508

(56) References Cited

U.S. PATENT DOCUMENTS

| | | | |
|---|---|---|---|
| 5,198,479 A | * | 3/1993 | Shiobara et al. ............ 523/214 |
| 5,338,782 A | * | 8/1994 | Corley ........................ 523/466 |
| 5,458,929 A | * | 10/1995 | Earls et al. .................... 428/1 |
| 6,001,483 A | * | 12/1999 | Harada et al. .............. 428/413 |
| 6,210,811 B1 | * | 4/2001 | Honda et al. ............... 428/620 |
| 6,221,510 B1 | * | 4/2001 | Noro et al. ................. 428/620 |
| 6,555,602 B1 | * | 4/2003 | Harada et al. .............. 523/466 |

FOREIGN PATENT DOCUMENTS

| | | | |
|---|---|---|---|
| EP | 1 004 630 A1 | | 5/2000 |
| EP | 1 090 942 A1 | | 4/2001 |
| JP | 1-172420 A | * | 7/1989 |
| JP | 5-78445 A | * | 3/1993 |
| JP | 6-128546 A | * | 5/1994 |
| JP | 9-208805 A | | 8/1997 |
| JP | 9-255764 A | | 9/1997 |
| JP | 11-111741 A | * | 4/1999 |
| JP | 11-269351 A | | 10/1999 |
| WO | WO 96/15191 A | | 5/1996 |

* cited by examiner

Primary Examiner—Robert Sellers
(74) Attorney, Agent, or Firm—Sughrue Mion, PLLC

(57) ABSTRACT

A process for producing an epoxy resin composition for photosemiconductor element encapsulation which, even when a filler or the like is not contained therein, can have a viscosity necessary for molding and hence be satisfactorily molded to give a cured resin less apt to have defects such as burrs or bubbles. The process, which is for producing an epoxy resin composition for photosemiconductor element encapsulation comprising an epoxy resin, a hardener and a hardening accelerator as constituent ingredients, comprises: a first step of melt-mixing the ingredients together; and a second step of regulating viscosity of the molten mixture obtained in the first step at a given temperature.

1 Claim, No Drawings

PROCESS FOR PRODUCING EPOXY RESIN COMPOSITION FOR PHOTOSEMICONDUCTOR ELEMENT ENCAPSULATION

FIELD OF THE INVENTION

The present invention relates to a process for producing an epoxy resin composition for use in the encapsulation of photosemiconductor elements.

DESCRIPTION OF THE RELATED ART

Epoxy resin compositions have conventionally been used extensively as resin compositions for use in the encapsulation of photosemiconductor elements such as LEDs (light-emitting diodes). Such an epoxy resin composition for photosemiconductor element encapsulation usually comprises an epoxy resin, a hardener, and a hardening accelerator. This composition is generally used in the following manner. These ingredients are melt-mixed beforehand to obtain semi-cured (B-stage) tablets. In molding, e.g., transfer molding, the tablets are thermally melted, charged into a mold in which a photosemiconductor element is disposed, and then cured to thereby encapsulate the photosemiconductor element.

However, when the melt of an epoxy resin composition for photosemiconductor element encapsulation has too low viscosity during molding, there are cases where the cured resin obtained therefrom has molding failures such as burrs and bubbles.

On the other hand, a technique for preventing such molding failures is known in which the viscosity of a resin composition to be used for molding is increased by, for example, incorporating a filler or the like thereinto.

However, epoxy resin compositions for photosemiconductor element encapsulation are required to give transparent cured resins because it is necessary to secure satisfactory luminescence of encapsulated photosemiconductor elements. It is therefore undesirable to incorporate a filler or the like so as to increase viscosity.

SUMMARY OF THE INVENTION

The invention has been achieved in view of these circumstances.

An object of the invention is to provide a process for producing an epoxy resin composition for photosemiconductor element encapsulation which, even when a filler or the like is not contained therein, can have a viscosity necessary for molding and hence be satisfactorily molded to give a cured resin less apt to have defects such as burrs or bubbles.

In order to accomplish the object, the invention provides a process for producing an epoxy resin composition for photosemiconductor element encapsulation comprising an epoxy resin, a hardener and a hardening accelerator, as constituent ingredients, the process comprising: a first step of melt-kneading the ingredients together; and a second step of regulating viscosity of the molten mixture obtained in the first step at a given temperature.

According to this process, since the molten mixture comprising an epoxy resin, a hardener and a hardening accelerator, obtained in the first step, is regulated in viscosity at a given temperature in the second step, the resulting epoxy resin composition can have a viscosity necessary for molding, e.g., transfer molding, when the mixture is thermally melted in the molding operation.

In the second step, the molten mixture is preferably spread into a sheet form and allowed to stand in this state at a given temperature.

By allowing the sheet-form spread mixture to stand at a given temperature, viscosity regulation can be conducted uniformly and efficiently.

DETAILED DESCRIPTION OF THE INVENTION

The term "given temperature" used herein generally means a temperature of about 35 to 80° C.

The epoxy resin composition for photosemiconductor element encapsulation to be produced by the invention comprises an epoxy resin, a hardener and a hardening accelerator.

Examples of the epoxy resin include bisphenol A epoxy resins; bisphenol F epoxy resins; novolac epoxy resins such as phenolic novolac epoxy resins and cresol novolac epoxy resins; alicyclic epoxy resins; nitrogen-containing epoxy resins such as triglycidyl isocyanurate and hydantoin epoxy resins; hydrogenated bisphenol A epoxy resins; aliphatic epoxy resins; glycidyl ether epoxy resins; bisphenol S epoxy resins; and biphenyl epoxy resins, dicyclo epoxy resins and naphthalene epoxy resins, which are mainly used as epoxy resins of the type giving low water absorption cured resins. These epoxy resins may be used alone or in combination of two or more thereof. Preferred of these epoxy resins are bisphenol A epoxy resins, bisphenol F epoxy resins, novolac epoxy resins, alicyclic epoxy resins and triglycidyl isocyanurate, which are excellent in transparency and resistance to discoloration.

Although such an epoxy resin may liquid at room temperature (e.g., about 15–35° C.), an epoxy resin which is solid at room temperature is preferably used. In general, epoxy resins having an average epoxy equivalent of from 90 to 1,000 are preferably used. Further, epoxy resins having a softening point of 160° C. or lower are preferably used. If an epoxy resin having an epoxy equivalent lower than 90 is used, there are cases where the epoxy resin composition for photosemiconductor element encapsulation, containing such an epoxy resin gives a brittle cured resin. On the other hand, if an epoxy resin having an epoxy equivalent exceeding 1,000 is used, there are cases where the composition containing such an epoxy resin gives a cured resin having a lowered glass transition temperature ($T_g$).

Examples of the hardener used in the invention include acid anhydride hardeners and phenolic hardeners. Examples of the acid anhydride hardeners include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride and methyltetrahydrophthalic anhydride. These may be used alone or in combination of two or more thereof. Preferred of these acid anhydride hardeners are phthalic anhydride, hexahydrophthalic anhydride, tetrahydrophthalic anhydride, and methylhexahydrophthalic anhydride. Preferred acid anhydride hardeners are ones having a molecular weight of about from 140 to 200. Also preferred are acid anhydrides which are colorless or light-yellow.

Examples of the phenolic hardeners include phenolic novolac resin hardeners.

An epoxy resin and a hardener are mixed with each other in such a proportion that the amount of the active groups in the hardener (acid anhydride groups or hydroxyl groups) reactive with epoxy groups is preferably from 0.5 to 1.5 equivalents, more preferably from 0.7 to 1.2 equivalents, per equivalent of the epoxy groups of the epoxy resin. If the amount of the active groups of the hardener is smaller than 0.5 equivalents, there are cases where the epoxy resin composition for photosemiconductor element encapsulation has a decreased curing rate and gives a cured resin having a lowered glass transition temperature. On the other hand, if the amount thereof exceeds 1.5 equivalents, there are cases where moisture resistance of a cured resin is impaired.

Besides the acid anhydride hardeners and phenolic hardeners, conventional hardeners for epoxy resins may be used according to the intended use of the composition. Examples the conventional hardener include amine hardeners, hardeners obtained by partially esterifying acid anhydride hardeners with an alcohol, and carboxylic acid hardeners such as hexahydrophthalic acid, tetrahydrophthalic acid, and methylhexahydrophthalic acid. Such hardeners may be used alone or in combination with one or more of acid anhydride hardeners and phenolic hardeners. For example, use of a carboxylic acid hardener in combination with an acid anhydride or phenolic hardener is effective in increasing the rate of curing and hence in improving productivity. In the case of using those hardeners also, the proportion thereof (equivalent ratio) may be the same as in the case of using acid anhydride hardeners and phenolic hardeners.

The hardening accelerator is not particularly limited. Examples thereof include 1,8-diazabicyclo[5,4,0]undecene-7, triethylenediamine, tertiary amines such as tri-2,4,6-dimethylaminomethylphenol, imidazole derivatives such as 2-ethyl-4-methylimidazole and 2-methylimidazole, phosphorus compounds such as triphenylphosphine, tetraphenylphosphonium tetraphenylborate, and tetra-n-butylphosphonium o,o-diethyl phosphorodithioate, quaternary ammonium salts, organic metal salts, and derivatives of these. Such hardening accelerators may be used alone or in combination of two or more thereof. Preferred of these hardening accelerators are the tertiary amines, imidazole derivatives and phosphorus compounds.

The content of the hardening accelerator is preferably from 0.01 to 8.0% by weight, more preferably from 0.1 to 3.0% by weight, based on the weight of the epoxy resin. If the content of the hardening accelerator is lower than 0.1% by weight, there are cases where a sufficient hardening-accelerating effect is not obtained. On the other hand, if the content thereof exceeds 8.0% by weight, there are cases where the composition gives a discolored cured resin.

Various known additives which have conventionally been used may be appropriately incorporated into the epoxy resin composition for photosemiconductor element encapsulation of the invention, if required and necessary. Examples the additives include deterioration inhibitors, modifiers, coupling agents, defoamers, inorganic powders, leveling agents, release agents, dyes and pigments.

Examples of the deterioration inhibitors include conventional deterioration inhibitors such as phenol compounds, amine compounds, organosulfur compounds, and phosphine compounds. Examples of the modifiers include conventional modifiers such as glycols, silicones, and alcohols. Examples of the coupling agents include conventional coupling agents such as the silane type and titanate type. Examples of the defoamers include conventional defoamers such as silicone compounds. Examples of the inorganic powders include conventional inorganic powders such as silica powders and glass powders.

In the process for producing an epoxy resin composition for photosemiconductor element encapsulation according to the invention, the ingredients described above are melt-mixed together in the first step. In the second step, the viscosity of the molten mixture obtained in the first step is regulated at a given temperature.

Specifically, in the first step, an epoxy resin is melt-mixed with a hardener and a hardening accelerator and optionally with various additives. This melt mixing may be conducted by a conventional method. For example, the following method may be employed: a method comprising introducing the ingredients into a vessel and melt-mixing them batchwise or a method comprising introducing the ingredients into a kneading machine (kneader or heated roll mill) and melt-mixing them continuously. It is however preferred to introduce the ingredients into a kneading machine to continuously melt-mix them. This continuous method of melt mixing enables efficient production.

This melt mixing operation in the first step is preferably conducted in the following manner. First, an epoxy resin is mixed with a hardener and optionally with various additives. After the epoxy resin and the hardener have been uniformly and sufficiently mixed with each other, a hardening accelerator and various optional additives are added to and mixed with the resulting molten mixture. In this method of melt mixing, a hardening accelerator is added to the molten mixture in which the epoxy resin and the hardener have been sufficiently and uniformly mixed with each other. Because of this, the epoxy resin and the hardener can be effectively prevented from locally reacting with each other before being sufficiently mixed with each other.

The mixing operation described above is preferably conducted in such a manner that an epoxy resin is mixed with a hardener and various optional additives with heating and the resulting molten mixture is mixed with a hardening accelerator and various optional additives with cooling. By conducting the mixing of the epoxy resin with the hardener and various optional additives with heating, these ingredients can be sufficiently and uniformly melt-mixed. Furthermore, by conducting the mixing of the resulting molten mixture with the hardening accelerator and various optional additives with cooling, the hardening accelerator can be sufficiently and uniformly mixed with the molten mixture while inhibiting the reaction of the epoxy resin with the hardener. For mixing with heating, the ingredients may be heated to about 100 to 160° C. with a heating apparatus such as a heater. For mixing with cooling, the ingredients may be cooled by circulating a cooling medium such as cooling water with a cooling apparatus such as a jacket.

The molten mixture obtained by the first step is in a semi-cured state (B-stage). This molten mixture is then cooled to ordinary temperature by air blowing or another means. Subsequently, in the second step, the molten mixture obtained in the first step is subjected to viscosity regulation at a given temperature.

The viscosity regulation may be accomplished by aging at a given temperature the molten mixture obtained in the first step. Specifically, the molten mixture is aged at a temperature of, for example, from 30 to 80° C., preferably from 40 to 60° C., for from 1 to 70 hours, preferably from 5 to 40 hours, although such conditions vary depending on the composition of the mixture.

Through this aging, the molten mixture is regulated so as to have a minimum melt viscosity as measured at 150° C. of generally from 2 to 50 Pa·s, preferably from 8 to 25 Pa·s, more preferably from 8 to 20 Pa·s, most preferably from 9 to 12 Pa·s. If the viscosity of the molten mixture is lower than the lower limit, there are cases where molding failures such as burrs and bubbles result. If the viscosity thereof is higher than the upper limit, there are cases where molding failures such as unfilled spaces and wire sway result. Viscosity can be measured with a KOUKA-flow tester (manufactured by Shimadzu Corp.).

This aging is preferably conducted while maintaining the molten mixture in a sheet-form spread state. The sheet-form spread state enables the molten mixture to be uniformly and efficiently regulated in viscosity. Although the molten mixture can be aged in the form of a mass, this aging tends to cause gelatin in a central part thereof.

For bringing the molten mixture obtained in the first step into a sheet-form spread state, the molten mixture may, for example, be spread on a pallet or the like. The thickness of the spread sheet is regulated to preferably from 2 to 70 mm, more preferably from 2 to 40 mm, most preferably from 6 to 25 mm, by regulating the amount of the molten mixture to be spread. If the thickness thereof is smaller than the lower limit, the molten mixture has too large surface area, so that there are cases where the composition absorbs water upon temperature changes before and after the aging to give a cured resin having a lowered glass transition temperature ($T_g$). If the thickness thereof is larger than the upper limit, there are cases where the composition gels due to heat build-up. Furthermore, thicknesses of from 2 to 40 mm, especially from 6 to 25 mm, are advantageous in that they result in stable viscosities.

After having undergone the aging, the epoxy resin composition for photosemiconductor element encapsulation is cooled again to ordinary temperature by air blowing or another means. Thereafter, the composition may be formed into tablets through pulverization and tableting in a conventional manner.

The epoxy resin composition for photosemiconductor element encapsulation thus obtained is used for the encapsulation of photosemiconductor elements such as LEDs and CCDs. For example, in using this epoxy resin composition for encapsulating a photosemiconductor element by molding, e.g., transfer molding, the composition is thermally melted, charged into a mold in which the photosemiconductor element is disposed, and then cured to thereby encapsulate the photosemiconductor element.

When the epoxy resin composition for photosemiconductor element encapsulation produced by the process described above is thermally melted in molding, e.g., transfer molding, a viscosity necessary for the molding can be secured because the molten mixture obtained in the first step, which comprises an epoxy resin, a hardener and a hardening accelerator, was regulated in viscosity at a given temperature in the second step. As a result, satisfactory molding in which molding failures such as burrs or bubbles are diminished can be conducted without the necessity of incorporating a filler or the like.

The invention will be explained below in more detail by reference to the following Examples, but the invention should not be construed as being limited to these Examples.

EXAMPLE 1

An epoxy resin composition for photosemiconductor element encapsulation was prepared according to the formulation shown below.

That is, epoxy resins were melt-mixed with a hardener at 120° C. with a kneading machine. A hardening accelerator was added to the resulting molten mixture of the epoxy resins and the hardener, and these ingredients were mixed while being cooled.

Formulation for Epoxy Resin Composition for Photosemiconductor Element Encapsulation Epoxy Resins:

| Bisphenol A epoxy resin (epoxy equivalent: 650) | 80 parts by weight |
|---|---|
| Triglycidyl isocyanurate | 20 parts by weight |

Hardener:

| 4-Methylhexahydrophthalic anhydride/hexahydrophthalic anhydride mixture | 50 parts by weight |
|---|---|

Hardening Accelerator:

| 2-Ethyl-4-methylimidazole | 0.4 parts by weight |
|---|---|

The molten mixture obtained was cooled to ordinary temperature by air blowing. This molten mixture was spread on a pallet into a sheet form having a thickness of 0.5 mm and then aged at 50° C. for 20 hours to thereby regulate the resulting epoxy resin composition for photosemiconductor element encapsulation so as to have a minimum melt viscosity as measured at 150° C. of 7 Pa·s.

After the aging, the sheet was cooled again to ordinary temperature by air blowing and then pulverized and tableted. Thus, an epoxy resin composition for photosemiconductor element encapsulation was obtained as tablets.

EXAMPLE 2

An epoxy resin composition for photosemiconductor element encapsulation was obtained as tablets in the same manner as in Example 1, except that the molten mixture was spread in a 2 mm-thick sheet form on a pallet and aged. After the aging, the epoxy resin composition for photosemiconductor element encapsulation had a minimum melt viscosity as measured at 150° C. of 8 Pa·s.

EXAMPLE 3

An epoxy resin composition for photosemiconductor element encapsulation was obtained as tablets in the same manner as in Example 1, except that the molten mixture was spread in a 6 mm-thick sheet form on a pallet and aged. After the aging, the epoxy resin composition for photosemiconductor element encapsulation had a minimum melt viscosity as measured at 150° C. of 9 Pa·s.

EXAMPLE 4

An epoxy resin composition for photosemiconductor element encapsulation was obtained as tablets in the same manner as in Example 1, except that the molten mixture was spread in a 10 mm-thick sheet form on a pallet and aged. After the aging, the epoxy resin composition for photosemiconductor element encapsulation had a minimum melt viscosity as measured at 150° C. of 10 Pa·s.

EXAMPLE 5

An epoxy resin composition for photosemiconductor element encapsulation was obtained as tablets in the same manner as in Example 1, except that the molten mixture was spread in a 25 mm-thick sheet form on a pallet and aged. After the aging, the epoxy resin composition for photosemiconductor element encapsulation had a minimum melt viscosity as measured at 150° C. of 12 Pa·s.

EXAMPLE 6

An epoxy resin composition for photosemiconductor element encapsulation was obtained as tablets in the same manner as in Example 1, except that the molten mixture was spread in a 40 mm-thick sheet form on a pallet and aged. After the aging, the epoxy resin composition for photosemiconductor element encapsulation had a minimum melt viscosity as measured at 150° C. of 20 Pa·s.

EXAMPLE 7

An epoxy resin composition for photosemiconductor element encapsulation was obtained as tablets in the same manner as in Example 1, except that the molten mixture was spread in a 70 mm-thick sheet form on a pallet and aged. After the aging, the epoxy resin composition for photosemiconductor element encapsulation had a minimum melt viscosity as measured at 150° C. of 25 Pa·s.

EXAMPLE 8

An epoxy resin composition for photosemiconductor element encapsulation was obtained as tablets in the same manner as in Example 1, except that the molten mixture was spread in an 80 mm-thick sheet form on a pallet and aged. After the aging, the epoxy resin composition for photosemiconductor element encapsulation had a minimum melt viscosity as measured at 150° C. of 30 Pa·s.

Comparative Example

An epoxy resin composition for photosemiconductor element encapsulation was obtained as tablets in the same manner as in Example 1, except that the mixture obtained by melt-mixing the ingredients with the kneading machine was directly pulverized and tableted without being aged. After the melt mixing, the epoxy resin composition for photosemiconductor element encapsulation had a minimum melt viscosity as measured at 150° C. of 0.2 Pa·s.

Evaluation

Tablets of the epoxy resin compositions for photosemiconductor element encapsulation obtained in Examples 1 to 8 and Comparative Example were used to encapsulate an LED by transfer molding (150° C.×3 min; after cure, 150° C.×3 hr) to examine the occurrence of burrs and bubbles in the molding. The results obtained are shown in the Table below.

The glass transition point ($T_g$) of each of the cured resins formed from the compositions of Examples 1 to 8 and Comparative Example was measured with a differential scanning calorimeter (DSC) (Type Pyris-1, manufactured by Perkin-Elmer Corp.) The results obtained are shown in the Table below.

TABLE

|  | Example | | | | | | | | Comparative |
|---|---|---|---|---|---|---|---|---|---|
|  | 1 | 2 | 3 | 4 | 5 | 6 | 7 | 8 | Example 1 |
| Sheet thickness (mm) | 0.5 | 2 | 6 | 10 | 25 | 40 | 70 | 80 | No sheet aging |
| Minimum melt viscosity at 150° C. (Pa·s) | 7 | 8 | 9 | 10 | 12 | 20 | 25 | 30 | 0.2 |
| Burrs in molding | None | None | None | None | None | None | None | None | Many burrs |
| Bubbles in molding | none | none | none | none | none | none | none | some bubbles | Many bubbles |
| $T_g$ (° C.) | 120 | 128 | 128 | 128 | 128 | 128 | 128 | 128 | 128 |

The above Table shows the following. The cured resins obtained from the compositions of Examples 2 to 7 had undergone no burr or bubble formation in the molding and further had a high $T_g$. The cured resin obtained from the composition of Example 1 had a low $T_g$, although free from burr or bubble formation in the molding. Furthermore, the composition of Example 8 underwent slight bubble formation in the molding. This is thought to be attributable to the reduced flowability in molding due to partial gelation in aging. In contrast to these, in the composition of the Comparative Example, many burrs and bubbles were formed in the molding.

According to the process for producing an epoxy resin composition for photosemiconductor element encapsulation of the invention, when the epoxy resin composition produced by the process is thermally melted in molding, e.g., transfer molding, a viscosity necessary for the molding can be secured because the molten mixture obtained in the first step, which comprises an epoxy resin, a hardener and a hardening accelerator, is regulated in viscosity at a given temperature in the second step. As a result, satisfactory molding in which molding failures such as burrs or bubbles are diminished can be conducted without the necessity of incorporating a filler or the like.

What is claimed is:

1. A process for producing an epoxy resin composition for photosemiconductor element encapsulation comprising an epoxy resin, a hardener and a hardening accelerator, as constituent ingredients, said process comprising:

a first step of melt-mixing the ingredients together to a semi-cured, B-stage state; and a second step of regulating viscosity of the molten mixture obtained in the first step by aging at a temperature of from 30–80° C.

* * * * *